(12) United States Patent
Dalton et al.

(10) Patent No.: US 7,378,350 B2
(45) Date of Patent: May 27, 2008

(54) FORMATION OF LOW RESISTANCE VIA CONTACTS IN INTERCONNECT STRUCTURES

(75) Inventors: Timothy J Dalton, Ridgefield, CT (US); Stephen M Gates, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 11/182,445

(22) Filed: Jul. 15, 2005

(65) Prior Publication Data

US 2005/0266681 A1  Dec. 1, 2005

Related U.S. Application Data

(62) Division of application No. 10/665,584, filed on Sep. 19, 2003, now abandoned.

(51) Int. Cl.
*H01L 21/311* (2006.01)

(52) U.S. Cl. ............... 438/694; 438/700; 257/E21.579

(58) Field of Classification Search ........ 438/694–696, 438/700–702, 745–746; 257/E21.429, E21.294, 257/E21.3, E21.576, E21.577, E21.578, E21.579
See application file for complete search history.

(56) References Cited

U.S. PATENT DOCUMENTS

| | | | |
|---|---|---|---|
| 4,884,123 A * | 11/1989 | Dixit et al. ............... 257/751 |
| 6,312,793 B1 | 11/2001 | Grill et al. ............... 428/312.6 |
| 6,337,277 B1 * | 1/2002 | Chou et al. ............... 438/689 |
| 6,358,832 B1 * | 3/2002 | Edelstein et al. ........... 438/612 |
| 6,441,491 B1 | 8/2002 | Grill et al. ................. 457/759 |
| 6,479,110 B2 | 11/2002 | Grill et al. ................. 427/577 |
| 6,848,455 B1 * | 2/2005 | Shrinivasan et al. ......... 134/1.3 |
| 2001/0045651 A1 * | 11/2001 | Saito et al. ................. 257/750 |

* cited by examiner

*Primary Examiner*—Thanhha Pham
(74) *Attorney, Agent, or Firm*—Ohlandt, Greeley, Ruggiero & Perle, L.L.P.; Daniel P. Morris, Esq.

(57) ABSTRACT

A method of fabricating BEOL interconnect structures on a semiconductor device having a plurality of via contacts with low via contact resistance is provided. The method includes the steps of: a) forming a porous or dense low k dielectric layer on a substrate; b) forming single or dual damascene etched openings in the low k dielectric; c) placing the substrate in a process chamber on a cold chuck at a temperature about −200° C. to about 25° C.; d) adding to the process chamber a condensable cleaning agent (CCA) to condense a layer of CCA within the etched openings on the substrate; and e) performing an activation step while the wafer remains cold at a temperature of about −200° C. to about 25° C. The via contacts are very stable during thermal cycles and during operation of the semiconductor device.

22 Claims, 2 Drawing Sheets

FORMATION OF LOW RESISTANCE VIA CONTACTS IN INTERCONNECT STRUCTURES

This application is a Divisional of and claims priority from the commonly-owned U.S. application Ser. No. 10/665,584, filed Sep. 19, 2003 now abandoned.

BACKGROUND OF THE INVENTION

1. Field of the Invention

The present invention generally relates to integrated circuits (ICs). More particularly, the present invention relates to interconnect structures, including multilevel interconnect structures fabricated by damascene methods in which the via contact resistance must be low. The present invention describes various methods and tooling for making improved interconnect structures based on copper damascene wiring having a reduced via contact resistance and stable resistance both during IC operation and reliability stress of the IC device.

2. Description of the Prior Art

Generally, semiconductor devices include a plurality of circuits, which form an integrated circuit fabricated on a silicon single crystal substrate. A complex network of signal paths will normally be routed to connect the circuit elements distributed on the surface of the substrate. Efficient routing of these signals across the device requires the formation of multi-level or multi-layered interconnection schemes, such as, dual damascene wiring structures based on copper. Copper based interconnects are desirable due to their efficacy in providing high speed signal transmission between large numbers of transistors on a complex semiconductor chip.

Within the interconnection structure, metal vias run perpendicular to the silicon substrate and metal lines run parallel to the silicon substrate. Further enhancement of the speed of signals and reduction of interaction of signals in adjacent copper lines (known as "cross-talk") is achieved in new IC product chips by surrounding the copper lines and vias in a low k or ultralow k dielectric.

Presently, interconnect structures formed on an integrated circuit chip includes at least about 2 to 10 wiring levels fabricated at a minimum lithographic feature size designated about 1× (referred to as "thinwires") and above these levels are about 2 to 4 wiring levels fabricated at a larger size (referred to as "fatwires"). In one class of prior art structures, the thinwires are formed in a low dielectric constant (k) material having a dielectric constant between about 2 and about 3.5.

However, fabrication problems are associated with these prior art structures. For example, the via contact resistance is high in prior structures due to contamination at the via to line interface. Contamination primarily includes oxygen and/or carbon and is in the form of copper oxide (Cu Oxide) or a carbon based residue (polymeric or amorphous carbon). The carbon residue commonly contains H or F and other undesired elements may be present at the via to line interface.

Another problem associated with these prior art structures is poor adhesion at the via contact, which leads to increased via resistance after the structure is cycled in temperature or after long periods of field operation. The extreme case of increased via resistance is an open via with no contact to the line below, a fatal IC failure mode. Poor adhesion is also due to the same contamination described above.

A further problem during interconnect fabrication is that the shapes and dimensions of the etched via and trench openings are correct after etch, but the shapes and dimensions are distorted, enlarged, degraded or roughened during via cleaning. This problem is most acute when low modulus ultralow k (ULK) dielectrics (k<about 2.7) are used and the via cleaning includes Ar+ bombardment. The Ar+ ions enlarge the via dimensions and erode the bottom of the trenches and even cause roughening of the trench bottom. Pores in the ULK dielectric make this problem severe.

SUMMARY OF THE INVENTION

It is therefore an object of the present invention to provide methods of improved fabrication of BEOL interconnect structures of the dual or single damascene type, with low via contact resistance.

It is also an object of the present invention to provide methods of improved fabrication of BEOL interconnect structures of the dual or single damascene type, in which all the vias on the IC are very stable in resistance (the via resistance does not change or goes down) after thermal cycling of the structure.

It is a further object of the present invention to provide methods for improved fabrication of BEOL interconnect structures of the dual or single damascene type in which all the vias on the IC have improved adhesion.

It is a further object of the present invention to provide methods for improved fabrication of BEOL interconnect structures of the dual or single damascene type in which the shapes of the etched via and trench openings are not distorted or changed during via cleaning.

It is a further object of the present invention to provide methods for improved fabrication of BEOL interconnect structures of the dual or single damascene type in which the bottoms of the etched trench openings are smooth after via cleaning and the other surfaces of the vias and lines remain smooth.

In keeping with these and other objects of the present invention, provided here are improved methods to clean the via contacts.

The above objects can be achieved by cleaning the via contact surfaces during fabrication of an interconnect structure.

Accordingly, the present invention provides a general method of making a BEOL interconnect structure including a porous or dense low k dielectric having low via contact resistance. The method includes the steps of:
 a) forming a porous or dense low k dielectric layer on a substrate;
 b) forming single or dual damascene etched openings in the low k dielectric;
 c) placing the substrate in a process chamber on a cold chuck at a temperature about −200° C. to about 25° C.;
 d) adding to the process chamber a condensable cleaning agent (CCA) to condense a layer of CCA within the etched openings on the substrate; and
 e) performing an activation step while the wafer remains cold at a temperature of about −200° C. to about 25° C.

The present invention further provides a method of making a BEOL interconnect structure including a porous or dense low k dielectric having low via contact resistance. The method includes the steps of:
 a) forming a porous or dense low k dielectric layer on a substrate;
 b) forming single or dual damascene etched openings in the low k dielectric;

c) placing the substrate in a first process chamber on a cold chuck at a temperature about −200° C. to about 25° C.;

d) adding to the first process chamber a condensable cleaning agent (CCA) to condense a layer of CCA within the etched openings on the substrate;

e) moving the substrate to a second process chamber on a cluster tool; and f) performing an activation step in the second process chamber.

The present invention still further provides a BEOL interconnect structure including a porous or dense low k dielectric having low via contact resistance prepared by the above methods of the present invention.

The via contacts prepared by the methods of the present invention are very stable during thermal cycles and during operation of the semiconductor device. Further, the via contacts prepared by the methods described herein have a lower resistance than the vias described in the prior art. In addition, in the present invention, the vias are surrounded by a liner (for example, see element 6 in FIG. 1) and the adhesion of the liner is stronger than it is in the vias described in the prior art. As a result, the interconnect structures of the present invention are more reliable and more stable than the interconnect structures of the prior art, because stronger liner adhesion leads to more reliable and stable interconnect structures.

These and other advantages of the present invention would be better understood from the detailed description of the invention and the preferred embodiments with reference to the drawings that follow.

DETAILED DESCRIPTION OF THE INVENTION

The present invention provides a non-destructive pre-clean process methods for liner/barrier deposition on low-k dielectrics.

In general, an integrated circuit will have interconnect levels, each level including metallic lines and vias that are of a dual damascene (via plus next level conductor) wiring interconnect structure for use on the IC chip. The metallic lines and vias are composed of the same or different conductive material. Suitable materials for use herein include, but are not limited to, W, Cu, Al, Ag, Au and alloys thereof and the like. A particularly preferred material is Cu.

The condensable cleaning agent (CCA) can be a reducing agent; metal based reducing agent, metal hydride; mixed metal hydride such as, LiAlH, molecular source of fluorine or a source of hydrogen, or a source of both hydrogen and silicon.

Examples of the latter include, but are not limited to disilane; trisilane; tetrasilane and other condensable silanes.

Molecular sources of fluorine include metal fluorides, such as, AlF3, TiF4, WF6, TaF6 and include inorganic fluorine compounds, such as, SF6, XeF2 and a mixture thereof; organic fluorine sources such as hexafluoropropyleneoxide, hexafluorobenzene, and include fluorinated higher silanes. Mixtures of the above compounds may be especially effective as the CCA.

Generally, the hydrides and hydrogen sources are effective to remove oxide and oxygen containing residues, while fluorine sources are used to remove carbon containing residues. Preferably, the activation step can be carried out by bombarding with He+ ions, H2+ ions and/or H+/H2+ mixtures. Alternatively, the activation step can be carried out by irradiating with electron beam or irradiating with an ultraviolet (UV) radiation.

The activation step can be carried out by lifting the substrate off the cold chuck with lift pins and thereafter heating the substrate with heating lamps.

Preferably, the lifted substrate is heated to a temperature about 350° C. to about 400° C., more preferably, the lifted substrate is heated to a temperature about 200° C. to about 450° C.

Figure 1:
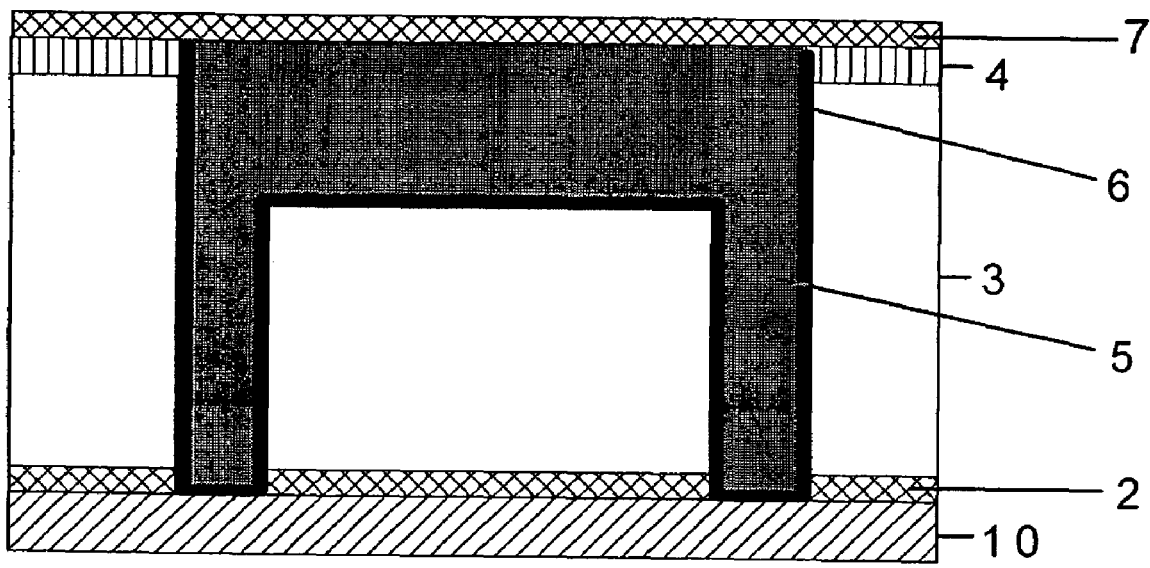
FIG. 1 is a schematic cross-sectional view of a completed interconnect level having a first layer having a set of metallic lines and vias therein and a diffusion barrier layer thereon.

Referring to FIG. 1, an example of dual damascene level is described in which a substrate 10 and an etch stop/barrier layer 2 are shown. On the etch stop/barrier is deposited the ILD 3 and an optional hardmask 4 is atop the ILD. It should be noted that the hardmask can be composed of a single or multiple layers to form a composite hardmask film. A Cu conductor 5 is formed within the ILD, separated from the ILD by the liner/Cu diffusion barrier 6.

A second etch stop/barrier layer 7 forms the "cap" on the Cu conductor. Each of the metallic lines and vias 5 can optionally include a liner material 6, which lines the metallic lines and vias.

Suitable materials that can be used as liners include, but are not limited to, TiN, TaN, Ta, WN, W, TaSiN, TiSiN, WCN, Ru and the like and mixtures thereof. The liner can be a single layer or it can include multiple layers.

Techniques and parameters for forming the metallic lines and vias are known in the art. Briefly, openings for defining lines and vias are formed utilizing conventional lithography (including applying a photoresist to a surface of the low-k organic dielectric layer) and etching. The etching step includes a conventional dry etching, such as, reactive ion etching, ion beam etching or plasma etching. The photoresist is then stripped from the layer utilizing conventional stripping processes.

Next, a conductive material is deposited on the liner, if one is used, or on the exposed surfaces of the openings employing conventional deposition processes, such as, CVD, plasma-assisted CVD, sputtering, plating, evaporation or chemical solution deposition. The conductive metal filled structure is then subjected to a conventional planarization process in which any residual conductive metal and/or liner outside the opening is substantially removed. For example, CMP may be used and after CMP the top horizontal portions of the metallic lines are approximately coplanar with the top surface of the first layer.

A diffusion barrier layer 7 can then be deposited as a continuous layer on the top surface thereof to complete the interconnect level. Diffusion barrier layer 7 is composed of any insulating material that is capable of preventing one of the above mentioned conductive metals from diffusing into the first layers formed above this interconnect level.

Figure 2:
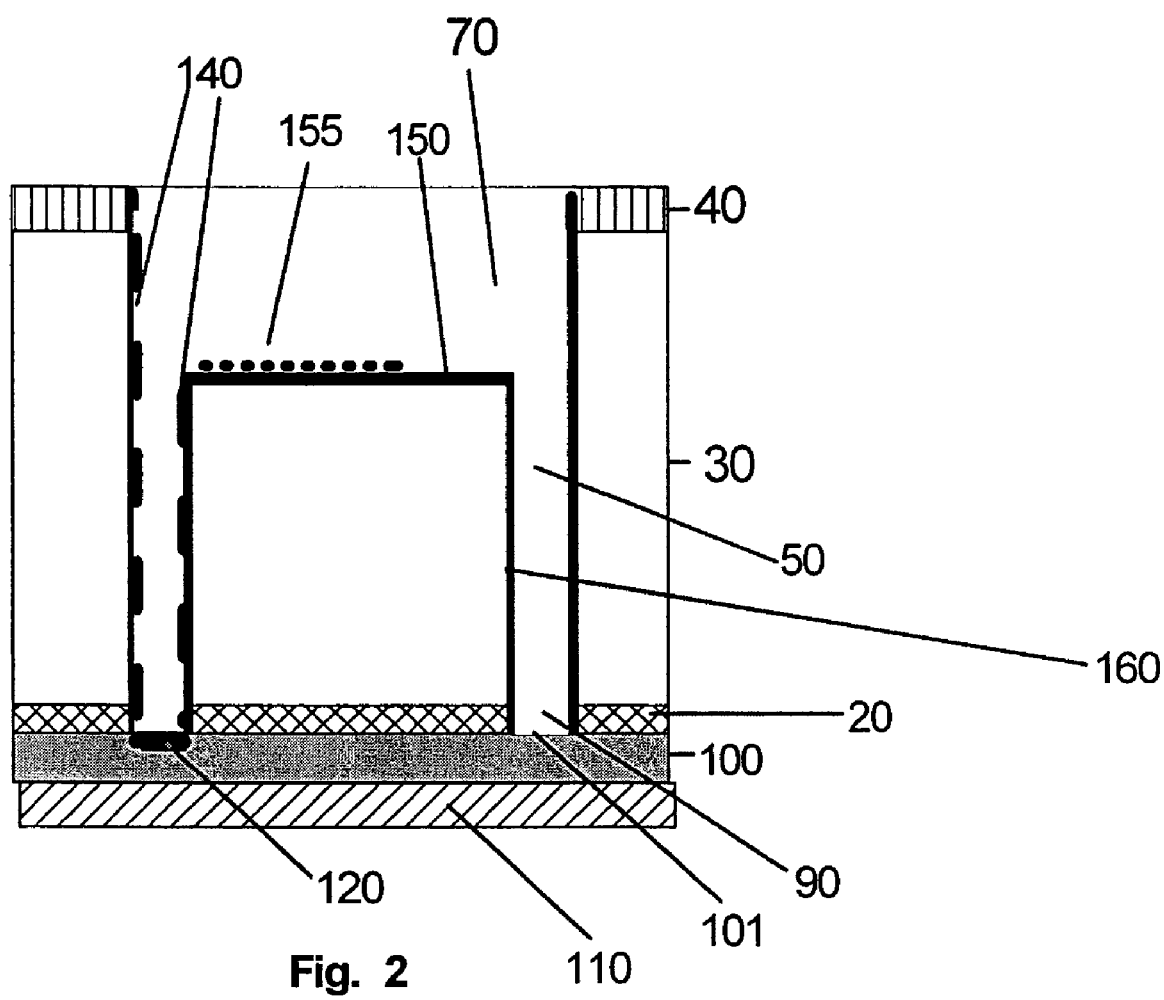
FIG. 2 is a schematic cross-sectional view of the etched via and line openings before any metallization of the openings.

The present invention, which is directed to cleaning of the via openings including the via contact to Cu line, is described in reference to FIG. 2.

Referring to FIG. 2, a via opening 50 and a line opening 70 etched in a dielectric layer 30 are shown. It should be noted that dielectric layer 30 may be homogeneous, or it may be composed of multiple layers. If multiple layers are presented, the interface between the two layers does not have to be concurrent with the interface between the line opening 70 and the via opening 50.

The dielectric may have k from 3.5 to 2, as described below. Below the dielectric 30 is a barrier/cap/etch stop layer 20 disposed atop a copper line below 100. The dielectric layer 30 may include an optional hardmask layer 40 which may be composed of a single or multiple layers to form a composite hardmask film.

All of the above components are disposed on a substrate 110.

After formation (by dry etching) of the openings 50 and 70, attention is drawn to the bottom of the via opening, where the barrier/cap/etch stop layer 20 has an etched opening 90. Opening 90 is known as the via bottom, where Cu 101 is exposed. The Cu surface may contain a Cu Oxide layer 120 due to Cu oxidation by the air, aqueous cleaning solution, partially oxygenated solvent cleaning solution, and other sources of oxygen such as the reactive feed gases used to form opening 90 in barrier/cap/etch stop layer 20. The Cu Oxide layer 120 may contain carbon and other elements. Also present within the via opening may be a variable thickness of carbon residue 140, which may contain H, F and other elements, may be polymeric or may be an amorphous carbon type material.

The carbon residue 140 is commonly present at the via bottom although FIG. 2 shows the residue on the sidewalls.

Commonly in the prior art, the residue 140 is removed by H atoms and other active species using a reducing H2 plasma or an oxidizing plasma, in a first cleaning step. Other common chemistries include one or more of the following gases: H2, O2, N2 and NH3.

The Ar+ ions employed in the prior art typically have kinetic energies from about 100 eV to about 1000 eV are used to remove the Cu Oxide 120 in a second cleaning step. When Ar+ ions are used, the ions cause damage to the exposed trench bottom 150 and to hardmask 40, where the dielectric is directly exposed to Ar+ bombardment.

During removal of the Cu Oxide layer, Cu atoms are sputtered from the via bottom onto the via sidewalls 160 and onto the trench floor, where Cu on the trench floor is shown as 155.

The substrate 110 may be a semiconductor wafer or chip that can be composed of any silicon-containing semiconductor material, such as, for example, Si, SiGe, Si/SiGe, Si/SiO$_2$/Si and the like. The substrate may be doped with dopants either n- or p-type depending on the desired device to be fabricated. The substrate may contain various isolation and/or device regions either formed in the substrate or on a surface thereof. The substrate may also contain metallic pads on the surface thereof. In addition to silicon-containing semiconductor materials, the substrate may be a circuit that includes CMOS devices therein.

Suitable dielectrics for layer 30 are porous or dense inorganic materials including, but not limited to, silicon-containing materials such as compositions formed from one or more of Si, C, O, F and H, e.g., FSG, C doped oxide, F doped oxide, alloys of Si, C, O and H and the like. Specific examples of PE CVD materials of the composition Si, C, O, and H include, but are not limited to, Black Diamond from Applied Materials, Coral from Novellus Systems and Aurora from ASM., all have k approximately 3.0, and include the range 2.8 to 3.2. Also, SiCOH dielectrics containing porosity and having k from 2.7 down to 1.8 may be preferably used within this invention, including BDII and BDIII from Applied Materials, Aurora ULK and ELK from ASM, and other porous SiCOH films. A variety of spin applied films having the composition Si, C, O, H, such as, methylsilsesquioxanes, siloxanes and 5109, 5117, 5525, 5530 from Japan Synthetic Rubber (JSR), and Dendriglass may also be used. The materials known as Orion and other materials from Trikon may also be used.

Techniques and parameters for forming first dielectric layer 30 on substrate 110 (e.g., PE CVD or spin coating) are within the purview of one skilled in the art. As is known in the art, PECVD from a cyclic precursor and a second hydrocarbon precursor is one preferred method to make SiCOH dielectrics with k between 2 and 3, as disclosed in U.S. Pat. Nos. 6,312,793; 6,441,491; and 6,479,110 B2, the contents of which are incorporated herein by reference.

Alternatively, the dielectric layer 30 may be a low-k organic materials such as the commercially available organic thermoset materials available from Dow Chemical Co. sold under the tradename SiLK™ or polyarylene ethers and the like. Additionally, dielectric layer 30 may be porous-SiLK™ from Dow Chemical Company.

Each of the present methods for via cleaning begins by placing the substrate containing elements 100-160 (see above) on a cooled wafer chuck at a temperature about −200 to about 25° C. and then a condensable cleaning agent (CCA) is added to the process chamber for a period from about 1 second to about 100 seconds, a time sufficient to condense from 0.1 to 100 monolayers of CCA.

As mentioned above, the condensable cleaning agent (CCA) is selected from reducing agents, molecular sources of fluorine, hydrogen sources and a source of both hydrogen and silicon.

Examples of the reducing agents include metal based reducing agents, such as, metal hydride; mixed metal hydrides, such as, LiAlH.

Examples of the source of both hydrogen and silicon include, but are not limited to, disilane; trisilane; tetrasilane and other condensable silanes.

Molecular sources of fluorine include metal fluorides, such as, AlF3, TiF4, WF6, TaF6 and include inorganic fluorine compounds, such as, SF6, XeF2 and a mixture thereof; organic fluorine sources such as hexafluoroproplyeneoxide, hexafluorobenzene, and include fluorinated higher silanes.

Mixtures of the above compounds may be especially effective as the CCA.

The preferred CCA's include disilane, higher silanes such as trisilane, metal hydride compounds, metal fluoride compounds such as AlF3, TiF4, WF6, TaF6, inorganic fluorine compounds, such as, SF6 or XeF2, mixed fluorinated higher silanes, mixed metal hydrides and fluorides and the like. Metal based reducing agents such as LiAlH, is also preferred.

In the methods of the present invention, the CCA is condensed on the cold wafer in the coating step, forming a thin layer in the via bottom (and roughly uniformly all across the wafer). Next, the CCA is activated in the activation step, the carbon-based contamination is converted to volatile organic compounds and the Cu Oxide is removed from the Cu surfaces.

In one embodiment, the activation step is performed by He+ ion or He+ and H+/H2+ bombardment while the wafer remains cold and 1 process chamber is used. In the bombardment step, He, and optionally H2, are flowed into the process chamber at flow rates from about 1 sccm to about 10000 sccm with a preferable flow rate range of about 100 to about 500 sccm for each gas species.

In another embodiment, the activation step is performed by electron beam irradiation or UV irradiation while the wafer is cold and a single process chamber is used. In the electron beam treatment, an electron energy from about 0.5 eV to about 100 keV, a dose of about 10 to about 1,000 micro Curies/cm$^2$ and a time of about 1 second to about 10,000 seconds are employed. A typical condition for this treatment is an electron energy from about 1 to about 10 keV, a dose of about 50 to about 500 micro Curies/cm$^2$.

In still another embodiment, the activation step is performed by heating the wafer and a single process chamber is used. Specifically, the wafer is lifted off the cold chuck using lift pins and then heating lamps are used to heat the lifted wafer to a temperature of about 350° C. to about 400° C. and preferably from about 200° C. to about 450° C.

In yet another embodiment, the activation step is performed in a separate process module on a cluster tool. First the substrate containing elements 100 to 160 is placed on a cooled wafer chuck at a temperature of −200° C. to about 25° C. in the process chamber described in the first embodiment and then, a condensable cleaning agent (CCA) is added to the process chamber for a period sufficient to condense (from about 1 to about 100 seconds), which is a time sufficient to condense from about 0.1 to about 100 monolayers of CCA.

Thereafter, the substrate is moved to a second process chamber wherein the substrate is irradiated with He+ ion or He+ and H+/H2+ ions, with electron beam radiation, with UV radiation, with thermal energy, or with another energy source.

In the second chamber, the wafer may not be lifted off the chuck. The chuck may be heated, for example, resistively, with a heating fluid, or with heating lamps, to the desired temperature.

In another embodiment, the activation step is performed using a noble gas plasma and at least 1 grid is placed between the plasma and the substrate. The grid is biased positive in order to repel positive ions, so that the substrate containing the condensed layer of CCA is activated with VUV light and electrons from the plasma. Optionally, a second grid is placed and biased negative to repel the electrons, so that only VUV light activates the CCA.

While we have shown and described several embodiments in accordance with our invention, it is to be clearly understood that same are susceptible to numerous changes that would be apparent to one skilled in the art. Therefore, we do not wish to be limited to only what is shown or described but contemplate all changes and modifications that are within the scope of the appended claims.

What is claimed is:

1. A method of making a BEOL interconnect structure including a porous or dense low k dielectric having low via contact resistance comprising the steps of:
    a) forming a porous or dense low k dielectric layer on a substrate;
    b) forming single or dual damascene etched openings in said porous or dense low k dielectric;
    c) placing said substrate in a process chamber on a cold chuck at a temperature about −200° C. to about 25° C.;
    d) adding to said process chamber a condensable cleaning agent (CCA) to condense a layer of CCA within said single or dual damascene etched openings in said porous or dense low k dielectric, said condensable cleaning agent (CCA) is selected from the group consisting of a metal hydride, a metal fluoride, an organic fluorine compound, an inorganic fluorine compound, a source of both hydrogen and silicon, and a combination thereof; and
    e) the layer of the condensable cleaning agent (CCA) while the substrate remains cold at a temperature of about −200° C. to about 25° C.

2. The method of claim 1, wherein said metal fluoride is selected from the group consisting of:
    AlF3, TiF4, WF6, TaF6 and a mixture thereof.

3. The method of claim 1, wherein said inorganic fluorine compound is selected from the group consisting of:
    AlF3, TiF4, WF6, TaF6, SF6, XeF2 and a mixture thereof.

4. The method of claim 1, wherein said organic fluorine compound is selected from the group consisting of:
    hexafluoroproplyeneoxide, hexafluorobenzene, fluorinated higher silane and a mixture thereof.

5. The method of claim 1, wherein said activation step comprises:
    bombarding with ions selected from the group consisting of He+ ions, H2+ ions, a mixture of H+ ions/H2ions, and a mixture of He+ ions, H+ ions, and H2+ ions.

6. The method of claim 1, wherein said activation step comprises: irradiating with electron beam or UV radiation.

7. The method of claim 1, wherein said activation step comprises:
    lifting said substrate off said cold chuck with lift pins; and thereafter
    heating said substrate with heating lamps.

8. The method of claim 7, wherein said lifted substrate is heated to a temperature about 350° C. to about 400° C.

9. The method of claim 8, wherein said lifted substrate is heated to a temperature about 200° C. to about 450° C.

10. The method of claim 1, wherein said porous or dense low k dielectric is selected from the group consisting of:
    silicon-containing material formed from one or more of Si, C, O, F and H, PE CVD materials having a composition Si, C, O, and H, a fluorosilicate glass (FSG), C doped oxide, F doped oxide and alloys of Si, C, O and H.

11. The method of claim 1, wherein the porous or dense low k dielectric is selected from the group consisting of:
    Black Diamond™, Coral™, Aurora™, Aurora ULK™, Aurora ELK™, BDII™, BDIII™, methylsilsesquioxanes™, siloxanes™, Materials made by JSR under product numbers 5109™, 5117™, 5525™, 5530™, Dendriglass™, Orion™, Trikon™ and a combination thereof.

12. A method of making a BEOL interconnect structure including a porous or dense low k dielectric having low via contact resistance comprising the steps of:
    a) forming a porous or dense low k dielectric layer on a substrate;
    b) forming single or dual damascene etched openings in said porous or dense low k dielectric;
    c) placing said substrate in a first process chamber on a cold chuck at a temperature about −200° C. to about 25° C.;
    d) adding to said first process chamber a condensable cleaning agent (CCA) to condense a layer of CCA within said single or dual damascene etched openings on said substrate, said condensable cleaning agent (CCA) is selected from the group consisting of a metal hydride, a metal fluoride, an organic fluorine compound, an inorganic fluorine compound, a source of both hydrogen and silicon, and a combination thereof;
    e) moving said substrate to a second process chamber on a cluster tool; and
    f) performing an activation step to activate the layer of CCA in said second process chamber.

13. The method of claim 12, wherein said metal fluoride is selected from the group consisting of:
AlF3, TiF4, WF6, TaF6 and a mixture thereof.

14. The method of claim 12, wherein said inorganic fluorine compound is selected from the group consisting of:
AlF3, TiF4, WF6, TaF6, SF6, XeF2 and a mixture thereof.

15. The method of claim 12, wherein said organic fluorine compound is selected from the group consisting of:
hexafluoroproplyeneoxide, hexafluorobenzene, fluorinated higher silane and a mixture thereof.

16. The method of claim 12, wherein said activation step comprises:
bombarding with ions selected from the group consisting of He+ ions, H2+ ions, a mixture of H+ ions/H2+ ions, and a mixture of He+ ions, H+ ions, and H2+ ions.

17. The method of claim 12, wherein said activation step comprises: irradiating with electron beam or UV radiation.

18. The method of claim 12, wherein said activation step comprises:
lifting said substrate off said cold chuck with lift pins; and thereafter
heating said substrate with heating lamps.

19. The method of claim 18, wherein said lifted substrate is heated to a temperature about 350° C. to about 400° C.

20. The method of claim 19, wherein said lifted substrate is heated to a temperature about 200° C. to about 450° C.

21. The method of claim 12, wherein said porous or dense low k dielectric is selected from the group consisting of:
silicon-containing material formed from one or more of Si, C, O, F and H, PE CVD materials having a composition Si, C, O, and H, a fluorosilicate glass (FSG), C doped oxide, F doped oxide and alloys of Si, C, O and H.

22. The method of claim 12, wherein the porous or dense low k dielectric is selected from the group consisting of:
Black Diamond™, Coral™, Aurora™, Aurora ULK™, Aurora ELK™, BDII™, BDIII™, methylsilsesquioxanes™, siloxanes™, Materials made by JSR under product numbers 5109™, 5117™, 5525™, 5530™, Dendriglass™, Orion™, Trikon™ and a combination thereof.

* * * * *